United States Patent [19]
Ullrich

[11] 4,084,106
[45] Apr. 11, 1978

[54] DYNAMIC SHIFT REGISTER USING INSULATED-GATE FIELD-EFFECT TRANSISTORS

[75] Inventor: Manfred Fritz Ullrich, Denzlingen, Germany

[73] Assignee: ITT Industries, Incorporated, New York, N.Y.

[21] Appl. No.: 746,984

[22] Filed: Dec. 2, 1976

[30] Foreign Application Priority Data

Dec. 17, 1975 Germany .............................. 2556828

[51] Int. Cl.² .............................................. G11C 19/28
[52] U.S. Cl. ............................ 307/221 C; 307/224 C; 307/269; 307/DIG. 4
[58] Field of Search ............ 307/220 R, 220 C, 221 R, 307/221 C, 223 C, 224 C, DIG. 4, 251, 270, 279, 269

[56] References Cited

U.S. PATENT DOCUMENTS

| 3,610,951 | 10/1971 | Howland | 307/221 C |
| 3,829,711 | 8/1974 | Crowle | 307/221 C |
| 3,909,627 | 9/1975 | Mizuno | 307/DIG. 4 X |

FOREIGN PATENT DOCUMENTS

| 2,340,770 | 2/1975 | Germany | 307/DIG. 4 |

OTHER PUBLICATIONS

West, "Practical Circuit Design Using M.O.S.", *Design Electronics*, vol. 8, No. 6, pp. 30-32, 37, 38, 3/1971.
Boss et al., "Powering Delay Circuit", *IBM Tech. Discl. Bull.*, vol. 16, No. 1, pp. 17-18, 6/1973.
Danielski et al., "Single Input Driver Circuit", *IBM Tech. Disc. Bull.*, vol. 18, No. 4, pp. 1033-1034, 9/1975.
Chu et al., "Bootstrap Push-Pull Driver", *IBM Tech. Discl. Bull.*, vol. 18, No. 3, pp. 710-711, 8/1975.

*Primary Examiner*—Larry N. Anagnos
*Attorney, Agent, or Firm*—John T. O'Halloran; Peter C. Van Der Sluys

[57] ABSTRACT

This dynamic two-phase clocked MOS shift register delivers the shifted signal in a non-inverted manner after half the clock pulse period and consists of six MOSFETs per stage.

1 Claim, 3 Drawing Figures

DYNAMIC SHIFT REGISTER USING INSULATED-GATE FIELD-EFFECT TRANSISTORS

BACKGROUND OF THE INVENTION

The present invention relates to a dynamic shift register usin insulated-gate field-effect transistors of the same conductivity type and with the same method of control which requires for its operation two non-overlapping clock signals, i.e., a so-called two-phase MOS shift register. "MOS" is an abbreviation for "metal oxide semiconductor field-effect transistor", but is no longer limited exclusively to field-effect transistors with an oxide layer as the insulating layer lying below the gate terminal, because other insulating-layer materials have become known.

A subgroup of dynamic two-phase MOS shift registers is known, for example, from a book by D. Becker and H. Mader, "Hochintegrierte MOS-Schaltungen", Stuttgart 1972, page 126, FIG. 6-41. The shift register described there is a two-phase MOS shift register employing the so-called ratio technique. The term "ratio technique" in short means the following: Each of the two half stages of a shift-register stage contains an inverter consisting of a switching transistor and a load transistor. The series resistance of these two MOS transistors in the conducting state is dependent on the ratio of the channel width w to the channel length $l$. To ensure reliable operation, these ratios must be chosen to be different in the two inverter transistors, with the load transistor having a smaller $w/l$ ratio than the switching transistor, i.e., the known dynamic two-phase MOS shift-register stage using the ratio technique has MOS transistors with different geometric layouts. In addition to the two clock signals, a dc voltage is necessary for operation.

Further subvarieties of dynamic MOS shift-register stages are known from the journal "The Electronic Engineer", March 1970, pages 59 to 61, FIG. 4 on page 60, for example, shows a shift-register stage described as being "ratioless", i.e. a two-phase MOS shift-register stage which dispenses with the above-mentioned choice of the ratios in the two inverter transistors. The inverter of that arrangement, however, consists of three series-connected MOS transistors, and this arrangement, too, requires a dc voltage in operation. Furthermore, suitable input capacitances of the two inverters must be chosen because the signal to be shifted is temporarily stored in these capacitances.

FIG. 6 on page 60 shows a two-phase MOS shift-register stage which requires no dc voltage in operation, but the two series-connected inverter transistors of a half stage have their free ends connected to one of the clock signals.

All prior art two-phase MOS shift-register stages have in each half stage, in addition to the aforementioned inverter, a coupling transistor which, in the case of the first-mentioned reference, couples the output of the inverter of the first half stage to the input of the inverter of the second half stage, with the input to the shift-register stage connected to the gate terminal of the switching transistor of the inverter of the first half stage, and the output coupled to the output of the inverter of the second half stage via the latter's switching transistor.

The arrangements disclosed in the second-mentioned reference show that a shift-register stage can also be formed by an arrangement whose input is connected to the gate terminal of the inverter of one half stage via the switching transistor of this half stage, while the output of the shift-register stage is coupled directly to the output of the inverter of the second half stage.

The known shift-register stages are universally applicable and can process any digital signal sequence, i.e., for example, a signal sequence in which the binary state HI, defined by a high potential, is followed in the next stage by such a state, too. At the end of a cycle of the two clock signals which are inverse to each other and do not overlap, this binary information has traveled from the input to the output of such a shift-register stage. To accomplish this shifting of the information, the inverter connected to the input inverts the signal and passes it to the gate terminal and to the input capacitance (see above) of the inverter of the second half stage during the first half cycle of the clock signal, and the second inverter inverts this signal again and passes it to the output during the second half cycle of the clock signal. The signal to be shifted thus appears at the output twice inverted, i.e., with the correct polarity.

If, in certain applications, it is necessary to be able to take off the signal with the correct polarity after the first clock-signal half cycle, i.e. in non-inverted form, it turns out that the known to-phase MOS shift-register stages cannot meet this requirement. It would be possible in principle to provide at the output of the first half stage an inverter which reinverts the inverted signal, so to speak; the time position of this reinverted signal would, however, be such that overlapping with the undelayed signal would be the inevitable consequence. The above-mentioned requirement can be met with the known two-phase MOS shift-register stages only by doubling the frequency of the clock signals and the number of shift register stages, i.e., forming from two adjacent shift-register stages a "new" shift-register stage at whose center the non-inverted signal can be taken off without overlap after one half cycle of the clock signal, as intended. The amount of circuitry required for this is obviously considerable.

SUMMARY OF THE INVENTION

The object of the invention is, therefore, to provide a dynamic shift-register wherein the signal to be shifted can be taken off without overlap and with the correct polarity after one half cycle of the clock signal.

According to a broad aspect of the invention, there is provided a dynamic insulated-gate field-effect transistor shift register of the type which requires first and second nonoverlapping clock signals coupled to first and second clock signal inputs for operation, and wherein each half of a stage includes at least one coupling transistor having one end of its controlled current path coupled to an information input, and at least one first switching transistor having one end of its controlled current path coupled to ground, each half stage comprising: a second switching transistor having its controlled current path coupled in series with that of said first switching transistor and one end of its controlled current path coupled to said first clock signal, the other end of the controlled current path of said coupling transistor coupled to the gate of said second switching transistor, and the gates of said coupling transistor and said first transistor coupled to said second clock signal input; and a capacitor coupled between the gate of said second switching transistor and the junction point of the controlled current paths of said first and second switching transistor for forming the information output of the half stage, said first and second clock signal inputs alternately coupled to said first and second clock signals in alternate half stages.

An advantage of the invention lies in the fact that no dc voltage is required for operation, while the limitation concerning the choice of capacitance values, as is imposed in the known arrangement referred to by way of introduction, is not present. Another advantage of the invention lies in the fact that the signals passing through the shift register have a defined amplitude after each half clock period; this applies in particular to the binary state HI, defined by a high potential — a property which the known two-phase MOS shift-registers do not have. In the latter, a threshold is fixed which is sufficient for reliable operation and above which the HI signal may have any value.

Because of the last-mentioned advantageous property, the dynamic shift-register in accordance with the invention can be used directly as a clock generator for further MOS circuits.

Furthermore, the dynamic shift-register in accordance with the invention is realizable as a "ratioless" shift-register, i.e., minimum areas are needed for the individual transistors. A further advantage, which should not be underestimated, is that a stage of the dynamic shift-register in accordance with the invention needs exactly half as many MOS transistors as the above-mentioned prior art arrangement fulfilling the same function. That arrangement requires two shift-register stages with fixed transistors each, i.e. a total of twelve transistors, while only six transistors per stage are needed in the invention.

The above and other objects of the present invention will be more clearly understood from the following detailed description taken in conjunction with the accompanying drawing, in which;

DESCRIPTION OF THE PREFERRED EMBODIMENT

Figure 1:
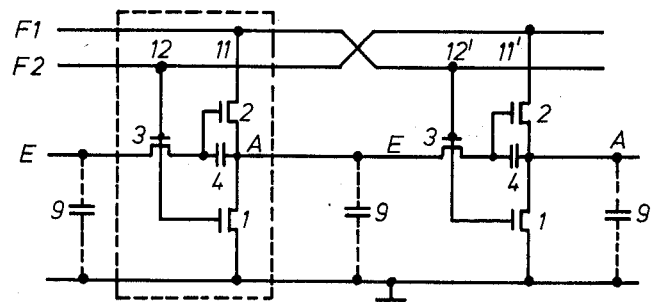
FIG. 1 is a circuit diagram of a stage of one embodiment of the invention.

The stage of the embodiment of FIG. 1 consists of two half stages, the left one of which is framed by a broken line. Each of these half stages includes the first switching transistor 1, one end of whose controlled current path is grounded, while the other end is connected to the controlled current path of the second switching transistor 2, the free end of whose controlled current path is connected to the first clock-signal input 11, 11'.

The controlled current path of the coupling transistor 3 is inserted between the information input E and the gate terminal of the second switching transistor 2; this gate terminal is connected via the capacitor 4 to the junction point of the two switching transistors 1 and 2, which simultaneously forms the information output A of the respective half stage. The gate terminals of the first switching transistor 1 and of the coupling transistor 3 are connected to the second clock-signal input 12, 12'.

The two half stages are driven by the clock-signals F1, F2. The first clock signal F1 is applied to the first clock-signal input 11 and to the second clock-signal input 12', while the second clock signal F2 is fed to the second clock-signal input 11'. In other words, the two clock signals F1, F2 are applied to successive half stages crosswise interchanged.

The operation of the arrangement of FIG. 1 is as follows:

Let the input E have the binary state HI. The binary state is passed through the coupling transistor 3, driven into the conducting state by the clock signal F2, to the gate terminal of the second switching transistor 2 and to the capacitor 4, so the latter is charged. During the next clock-signal half cycle, in which the clock signal F1 is applied to the clock-signal input 11, the second switching transistor 2 is thus turned on by the charged capacitor 4, and the HI potential reaches the output A in non-inverted form. The output signal at the output A assumes the defined value of the amplitude of the clock signal F1.

During the next half cycle of the clock signal, the potential at the point A of this half stage is forced into the LO state, because the clock signal F1 at the series combination of the two switching transistors 1, 2 changes to the LO state, too, whereby the first switching transistor 1 is turned on, with the second switching transistor 2 cut off. In each half stage, a shifted HI or LO state is thus followed by a LO state. This ensures that the duration of a HI state cannot become longer than one half cycle of the clock signal, i.e. any overlap is avoided by itself.

If, however, a HI state was present in a half stage, and a LO state has to be shifted during the respective clock-signal half cycle following the shifting of this HI state, the amplitude at the point A will not be equal to ground potential, but will be undefined. It is determined by the ratio of the capacitance $C_4$ of the capacitor 4 to the node capacitance $C_9$ of the subcircuit connected to the output A, with the following equation representing a good approximation:

$$U_{LO} = U_{HI} C_4 / C_9$$

Figure 3:
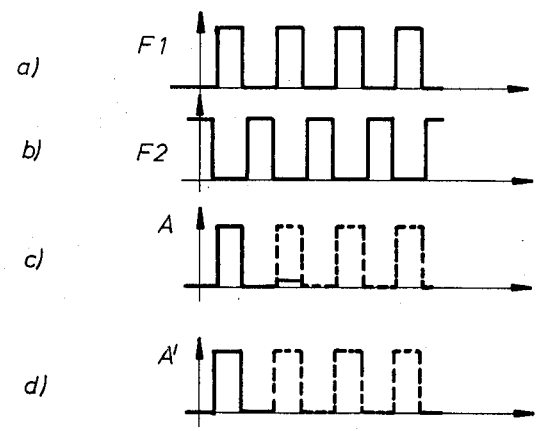
FIG. 3 shows waveforms occurring in the arrangements of FIGS. 1 and 2.

FIG. 3c shows such an amplitude.

In this special case, a sufficiently low amplitude $U_{LO}$ will be obtained if, as in the above-mentioned use as a clock generator, further subcircuits to be supplied with clock signals are connected to the outputs A.

Thus, the amplitude $U_{LO}$ occurs if a HI state was present at the output A two clock-signal half cycles earlier. In this case, the still charged capacitor 4 of the following half stage discharges to the circuit capacitance 9 through the coupling transistor 3. This results in the above-mentioned capacitive voltage division according to the ratio $C_4/C_9$. The permissible value for $U_{LO}$ is determined by the fact that the voltage remaining in the capacitor 4 after charge equalization must be smaller than the threshold voltage of the second switching transistor 2. In the next possible LO state, however, this residual charge has virtually completely disappeared.

Figure 2:
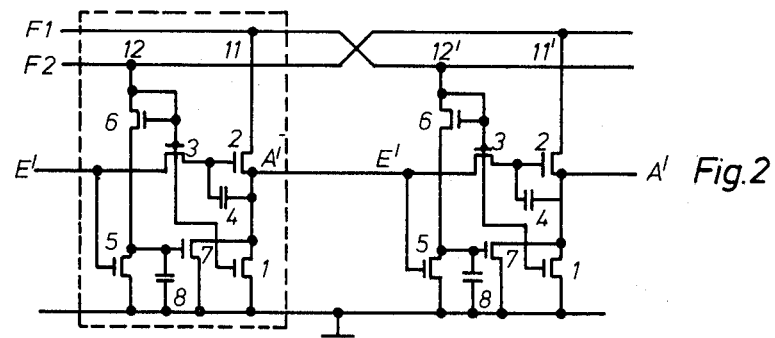
FIG. 2 is a circuit diagram of a stage of a second embodiment of the invention.

In an improvement of the arrangement of FIG. 1, shown in FIG. 2, additional components in each half stage ensure that after a HI state, the amplitude of the LO state always assumes the value of ground potential.

To this end, one half stage of this improvement includes an inverter consisting of an additional switching transistor 5 and an associated load transistor 6, which transistors, whose controlled current paths are in series, are connected between ground and the second clock-signal input 12, 12', which is also connected to the gate terminal of the load transistor 6. The gate terminal of the additional switching transistor 5 is coupled to the information input E' and, hence, to one end of the controlled current path of the coupling transistor 3.

The output of the inverter formed by the transistors 5, 6, i.e. the junction point of their two controlled current paths, is grounded via the additional capacitor 8 and connected to the gate terminal of the charge-eliminating transistor 7, whose controlled current path is connected to ground and to the output A' of this half stage. Thus, the controlled current path of the charge-eliminating transistor 7 is also in parallel with that of the first switching transistor 1. The inverter formed by the transistors 5, 6 is realized using the ratio technique mentioned by way of introduction.

The inverter formed by the transistors 5, 6 as well as the charge-eliminating transistor 7 permit the above-mentioned charge remaining in the capacitor 4 — this residual charge is responsible for the final value of the amplitude $U_{LO}$ — to flow to ground. As shown in FIG. 3d, the output signal A' in the LO state is practically identical with ground potential, i.e., the amplitude value $U_{LO}$, still visible only in the second pulse of FIG. 3c, is no longer visible in the second pulse of FIG. 4d.

The pulses shown by broken lines in FIGS. 3c and 3d are to indicate the basic behavior of the dynamic shift register in accordance with the invention, i.e., that a HI state is always followed by at least one LO state. FIGS. 3a and 3b show the waveforms of the clock signals F1, F2, which are non-overlapping, as can be seen.

The dynamic shift registers in accordance with the invention are, of course, made using integrated circuit technology, and are arranged on a common semiconductor crystal together with further MOS integrated circuits or bipolar circuits, particularly if they serve as clock generators.

What is claimed is:

1. A dynamic insulated-gate field-effect transistor shift register of the type which requires first and second non-overlapping clock signals coupled to first and second clock signal inputs for operation, and wherein each half of a stage includes at least one coupling transistor having one end of its controlled current path coupled to an information input, and at least one first switching transistor having one end of its controlled current path coupled to ground, each half stage comprising:

a second switching transistor having its controlled current path coupled in series with that of said first switching transistor and one end of its controlled current path coupled to said first clock signal, the other end of the controlled current path of said coupling transistor coupled to the gate of said second switching transistor, and the gates of said coupling transistor and said first transistor coupled to said second clock input; and a capacitor coupled between the gate of said second switching transistor and the junction point of the controlled current paths of said first and second switching transistor for forming the information output of the half stage, said first and second clock signal inputs alternately coupled to said first and second clock signals in alternate half stages;

a third switching transistor;

a load transistor coupled to said third switching transistor such that their controlled current paths are series connected between ground and said second clock signal input;

a charge eliminating transistor having its controlled current path coupled in parallel with that of said first switching transistor; and a second capacitor coupled between the gate terminal of said charge eliminating transistor and ground, the gate terminal of said third switching transistor coupled to said information input, the gate terminal of said load transistor coupled to said second clock signal input, and the gate terminal of said charge eliminating transistor coupled to the junction of the controlled current paths of said third switching transistor and said load transistor.

* * * * *